United States Patent [19]

Kurihara

[11] Patent Number: 5,703,396
[45] Date of Patent: Dec. 30, 1997

[54] PLASTIC ENCAPSULATED SEMICONDUCTOR DEVICE HAVING WING LEADS

[75] Inventor: Kenichi Kurihara, Tokyo, Japan

[73] Assignee: NEC Corporation, Japan

[21] Appl. No.: 739,890

[22] Filed: Oct. 31, 1996

[30] Foreign Application Priority Data

Oct. 31, 1995 [JP] Japan ................... 7-283542

[51] Int. Cl.$^6$ ............ H01L 23/12; H01L 23/50; H01L 23/02
[52] U.S. Cl. .............. 257/692; 257/696; 257/693; 257/666; 257/700
[58] Field of Search .............. 257/666, 787–789, 257/692, 693, 696, 698, 700–703, 668

[56] References Cited

U.S. PATENT DOCUMENTS

| | | | |
|---|---|---|---|
| 4,920,074 | 4/1990 | Shimizu et al. | 257/666 |
| 4,953,007 | 8/1990 | Erdos | 257/666 |
| 5,049,977 | 9/1991 | Sako | 257/711 |
| 5,436,492 | 7/1995 | Yamanaka | 257/704 |
| 5,623,162 | 4/1997 | Kurihara | 257/666 |

FOREIGN PATENT DOCUMENTS

| | | | |
|---|---|---|---|
| 59-94448 | 5/1984 | Japan | 257/701 |
| 61-99360 | 5/1986 | Japan | 257/666 |
| 63-133656 | 6/1988 | Japan . | |
| 6-151662 | 5/1994 | Japan | 257/666 |

*Primary Examiner*—Tom Thomas
*Assistant Examiner*—Alexander Oscar Williams
*Attorney, Agent, or Firm*—Hayes, Soloway, Hennessey, Grossman & Hage, P.C.

[57] ABSTRACT

In a plastic encapsulated semiconductor device, there is used a lead frame including an island for bearing thereon a semiconductor chip, a number of terminal leads extending outwardly from a proximity of the island, a pair of wing leads extending outwardly from a pair of opposite short-sides of the island. The wing leads are not coupled with tie-bars of the lead frame, and are positioned in a plane lower in level than a plane of the terminal leads. With this arrangement, even if pitch of the terminal leads is narrowed, the wing leads can be made not to interfere interfering with the terminal leads.

5 Claims, 6 Drawing Sheets

5,703,396

PLASTIC ENCAPSULATED SEMICONDUCTOR DEVICE HAVING WING LEADS

BACKGROUND OF THE INVENTION

1. Field of the Invention

The present invention relates to a plastic encapsulated semiconductor device having wing leads.

2. Description of Related Art

Referring to FIG. 1, there is shown one example of a conventional lead frame, which is generally designated with Reference Numeral 1, and includes a rectangular island (or die pad) 4 for bearing a semiconductor chip (not shown) thereon, a pair of hanger pins 3 extending outwardly from a pair of opposite long-sides of the rectangular island 4 to a frame 8 of the lead frame 1 so that the island 4 is supported by the frame 8, a number of outer leads 4 (of terminal leads) formed to extend out of a resin or plastic packaged semiconductor device, a number of inner leads 5 (of terminal leads) formed so as to be located within an inside of the plastic packaged semiconductor device and extending outwardly from a proximity of the island 4 to corresponding outer leads 4, and a pair of tie-bars 6 for tying the outer leads and for preventing flow-out of plastic when plastic packaging is carried out.

In one method for manufacturing a plastic packaged semiconductor device using the lead frame 1 mentioned above, a semiconductor chip (not shown) is die-bonded on the island 2 of the lead frame 1 mentioned above, and then, wire bonding is carried out to interconnect each of the electrodes on the semiconductor chip and a corresponding inner lead 5, and thereafter, the assembly thus obtained is molded or packaged with plastic in a volume defined by mold line 7 shown in FIG. 1. In this plastic packaging process, the plastic flowing out between each pair of adjacent leads is blocked by the tie-bars 6, so that plastic remains in the form of a burr or flash between each pair of adjacent leads in the inside of the tie-bars 6. Furthermore, the flash between each pair of adjacent leads and the tie-bars is cut out by cutting die. Thereafter, the outer leads 4 are plated with a desired metal, and then, a tip end of each output lead and the hanger pins are cut, so that the plastic packaged semiconductor device is separated from the outer frame 8 of the lead frame. In addition, the outer leads 4 are shaped or bent into a desired shape. Thus, the plastic packaged semiconductor device is completed.

When the plastic packaged semiconductor device manufactured as mentioned above is mounted on a printed circuit board by using solder, the problem was often encountered that, because of thermal shock at the time of performing solder dipping, moisture penetrating into the plastic molded body gasifies before it is expelled out from the plastic molded body, so that the gasified moisture expands within the plastic molded body, with the result that cracks occur in the plastic molded body.

In order to solve this problem, Japanese Patent Application Laid-open Publication JP-A-63-133656 proposes a lead frame having a wing lead as shown in FIG. 2. The disclosure of JP-A-63-133656 is incorporated by reference in its entirety into the present application. In FIG. 2, elements corresponding to those shown in FIG. 1 are given the same Reference Numerals, and explanation thereof will be omitted.

As seen from comparison between FIGS. 1 and 2, the lead frame generally designated with Reference Numeral 9 in FIG. 2 includes, in addition to the hanger pins 3, a pair of extensions 10 which extend outwardly from a pair of opposite short-sides of the rectangular island 4, each of the extensions 10 extending between a pair of inner leads 5 and coupled to the tie-bar 6. Since the extension 10 supports the island 2 but extends between the terminal leads, the extension 10 is called a "wing lead" in order to distinguish the extension 10 from the hanger pins 3.

When a plastic packaged semiconductor device is manufactured by using this lead frame 9, since a tip end of the wing leads 10 is exposed at the outside of the plastic molded body, the wing leads 10 function to expel the moisture penetrated into the plastic molded body to the outside of the plastic molded body, and therefore, can prevent occurrence of the cracks which would otherwise occur because of the heat added at the time of mounting the plastic packaged semiconductor device on the printed circuit board. Therefore, the wing leads are provided at a location where distance between the edge of the island and the edge of the plastic molded body (namely, the mold line 7) is the shortest. For example, in the lead frame shown in FIG. 2, the wing leads are provided at a center in a longitudinal direction of the plastic molded body. In addition, since the wing leads also act as island support leads, stable plastic molding can be realized.

However, a portion of the wing lead 10 positioned at the outside of the plastic molded body (the outside of the mold line 7) has to be cut out since that portion is not necessary as the wing lead. Therefore, the wing lead 10 should have been cut out together with the flash between each pair of adjacent leads and the tie-bars in a conventional tie-bar cutting process in which the flash between each pair of adjacent leads and the tie-bars are cut out by a cutting die. However, in order to cut the wing lead 10 together with the flash between each pair of adjacent leads and the tie-bars, since the wing lead 10 is added to the flash between each pair of adjacent leads and the tie-bars, it is necessary to modify the punch and die of a cutting die set to a shape capable of simultaneously cutting out not only the flash between each pair of adjacent leads and the tie-bars, but also the wing leads 10.

Referring to FIG. 3, there is shown a diagrammatic section view of the plastic packaged semiconductor device manufactured by using the lead frame having the wing leads. In FIG. 3, elements corresponding to those shown in FIG. 2 are given the same Reference Numerals. In FIG. 2, in addition, Reference Numeral 11 designates a semiconductor integrated circuit chip, and Reference Numeral 12 indicates a bonding wire. Reference Numeral 13 shows an encapsulating plastic molded body.

As shown in FIG. 3, the plane of the island 2 is positioned at a level lower than the plane in which the inner leads 5 are positioned and the output leads 5 extend out from the encapsulating plastic molded body 13. However, the wing lead 10 extending outwardly from the edge of the island 2 is bent since the wing lead is coupled to the tie bar 6 which is put in the same plane as that of the terminal leads 4 and 5, so that the wing leads 10 are drawn out from the encapsulating plastic molded body 13 in the same plane as that of the terminal leads 4 and 5.

As mentioned above, when the wing leads are provided in the lead frame, it is necessary to modify punch and die of the conventional cutting die set for the lead frame having no wing lead, into respective shapes capable of simultaneously cutting out not only the flash between each pair of adjacent terminal leads and the tie-bars, but also the wing leads.

Therefore, it is required to form the wing leads at the same positions in common to all semiconductor devices.

Furthermore, since the wing lead is formed between an pair of adjacent terminal leads, if a pitch of the terminal leads (namely, an interval between adjacent terminal leads) is narrowed in order to downsize or microminiaturize the semiconductor device, it is also necessary to modify the shape of the punch and die at a wing lead portion of the tie-bar cutting die set. This makes it difficult to machine the punch and the die. In addition, this reduces the lift time of parts of the cutting die set.

Because of the above mentioned circumstances, if the pitch of the terminal leads is narrowed, it has in some cases become impossible to provide the wing leads. In this case, the problem cannot be avoided in which, in an encapsulating process, the island is often exposed, and package cracks occur at the time of mounting the semiconductor device on printed circuit board. In addition, since the position of the wing leads is fixed, the degree of freedom in lead design is restricted.

SUMMARY OF THE INVENTION

Accordingly, it is an object of the present invention to provide a plastic encapsulated semiconductor device having wing leads, which has overcomes the above mentioned defects of the prior art.

Another object of the present invention is to provide an improved plastic encapsulated semiconductor device having wing leads with no hindrance even if pitch of terminal leads is narrowed.

The above and other objects of the present invention are achieved in accordance with the present invention by a plastic encapsulated semiconductor device comprising a semiconductor chip supported on an island, a plurality of terminal leads each having an inner lead and an outer lead, the inner lead of each terminal lead outwardly extending from a proximity of the island and being electrically connected to a corresponding electrode of the semiconductor chip through a connection wire, and at least one wing lead outwardly extending from the island between a pair of adjacent terminal leads of the terminal leads, and a plastic molded body encapsulating therein the semiconductor chip, the island, the inner lead of each terminal lead and the connection wire in such a manner that the outer lead of each terminal lead is projected from the plastic molded body and a tip end of the at least one wing lead is exposed from the plastic molded body so as to expel possible moisture contained in the plastic molded body, wherein the improvement is characterized in that the at least one wing lead is positioned in a plane different in level from a plane of the terminal leads, so that the at least one wing lead does not interfere with the terminal leads.

In one embodiment, the at least one wing lead has a bent portion in the way thereof. In addition, the at least one wing lead is positioned in a plane lower in level than the plane of the terminal leads.

According to another aspect of the present invention, there is provided a lead frame comprising an island for bearing a semiconductor chip, at least one hanger pin extending outwardly from the island to a frame of the lead frame, for supporting the island, a plurality of terminal leads each having an inner lead and an outer lead, the inner lead of each terminal lead outwardly extending from a proximity of the island, and the outer lead of each terminal lead outwardly continuously extending from a terminating end of the inner lead of the same terminal lead, at least one tie-bar mutually tying the terminal leads for preventing flow-out of plastic when plastic packaging is carried out, and at least one wing lead outwardly extending from the island between a pair of adjacent terminal leads and having a free outer end which is not coupled with the at least one tie-bar.

According to still another aspect of the present invention, there is provided a method for manufacturing a plastic encapsulated semiconductor device which comprises a semiconductor chip supported on an island, a plurality of terminal leads each having an inner lead and an outer lead, the inner lead of each terminal lead outwardly extending from a proximity of the island and being electrically connected to a corresponding electrode of the semiconductor chip through a connection wire, and at least one wing lead outwardly extending from the island between a pair of adjacent terminal leads of the terminal leads, and a plastic molded body encapsulating therein the semiconductor chip, the island, the inner lead of each terminal lead and the connection wire in such a manner that the outer lead of each terminal lead is projected from the plastic molded body and a tip end of the at least one wing lead is exposed from the plastic molded body so as to expel possible moisture contained in the plastic molded body, wherein the method is characterized by using a lead frame having the at least one wing lead having a free outer end which is not coupled to a tie-bar of the lead frame, and deforming the lead frame to cause the at least one wing lead to be positioned in a plane different in level from a plane of the terminal leads, so that the at least one wing lead does not interfere with the terminal leads.

Preferably, after the lead frame is deformed to cause the at least one wing lead to be positioned in a plane lower in level than the plane of the terminal leads, the semiconductor chip is die-bonded on the island, and the inner lead of each terminal lead is electrically connected to the corresponding electrode of the semiconductor chip through the connection wire, and thereafter, a plastic encapsulation is carried out by using a plastic-encapsulating lower molding die having a stepped portion at a position not higher in level than the plane of the at least one wing lead, and by putting the at least one wing lead on the stepped portion of the plastic-encapsulating lower molding die.

In a preferred embodiment, the at least one wing lead has a length longer than the distance between an outer edge of the island and a side surface of a plastic-encapsulating molding die, and is resiliently deformed so that the free outer end of at least one wing lead is pushed against the side surface of the plastic-encapsulating molding die when a plastic encapsulation is carried out.

The above and other objects, features and advantages of the present invention will be apparent from the following description of preferred embodiments of the invention with reference to the accompanying drawings.

DESCRIPTION OF THE PREFERRED EMBODIMENTS

Figure 1:
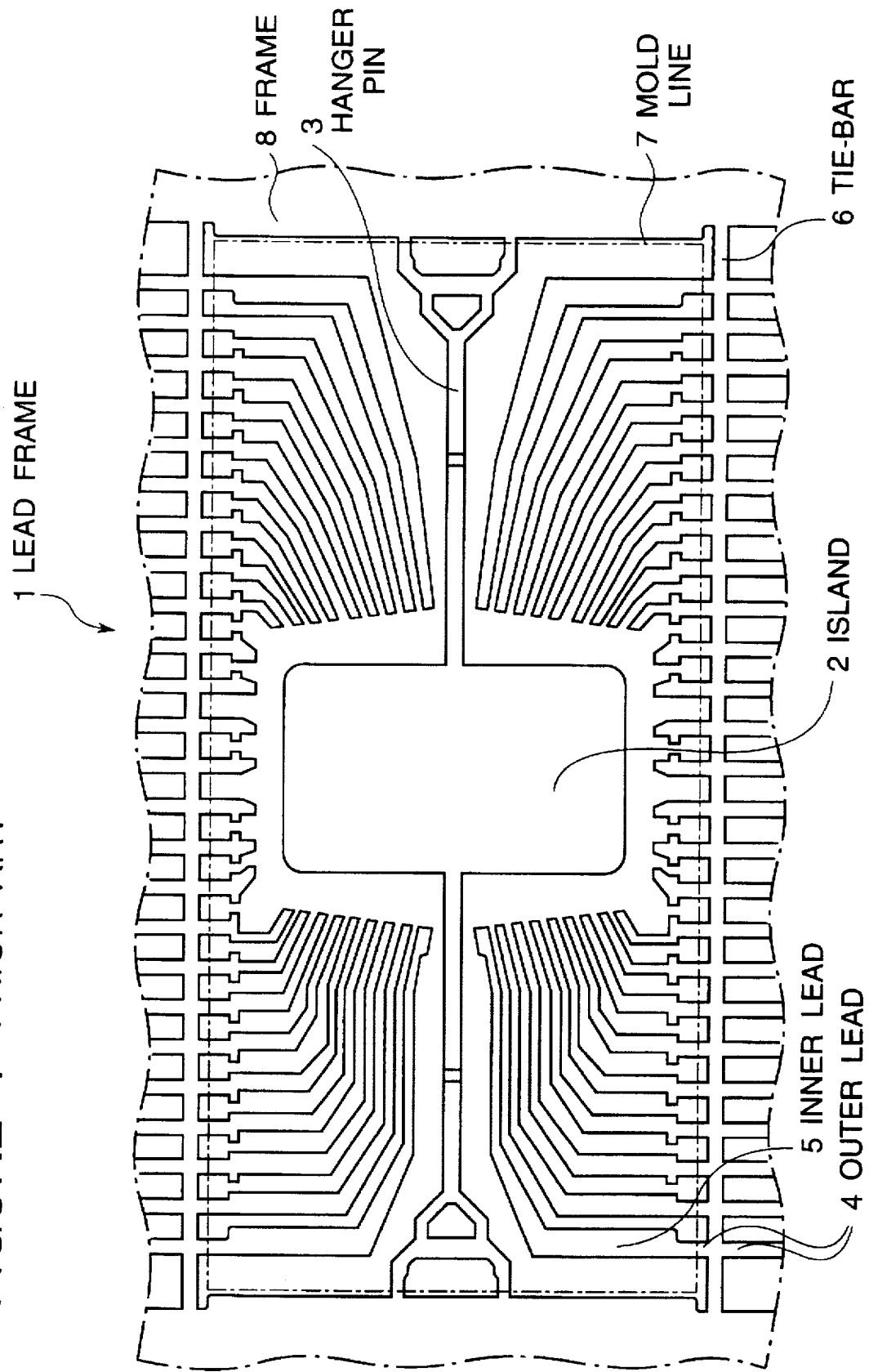
FIG. 1 is a pattern diagram of one example of a conventional lead frame.
Figure 2:
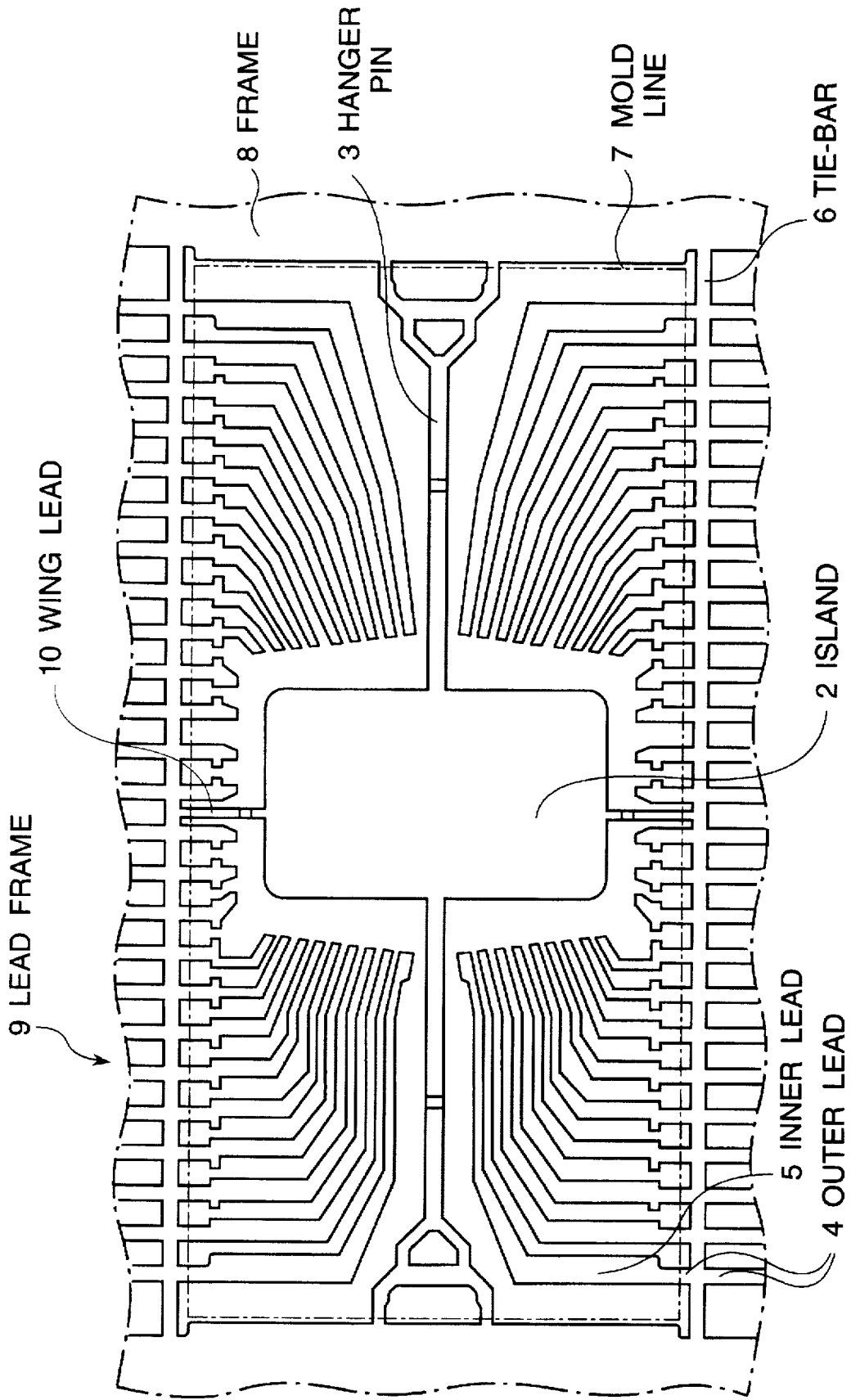
FIG. 2 is a pattern diagram of another example of a conventional lead frame, having a wing lead.
Figure 3:
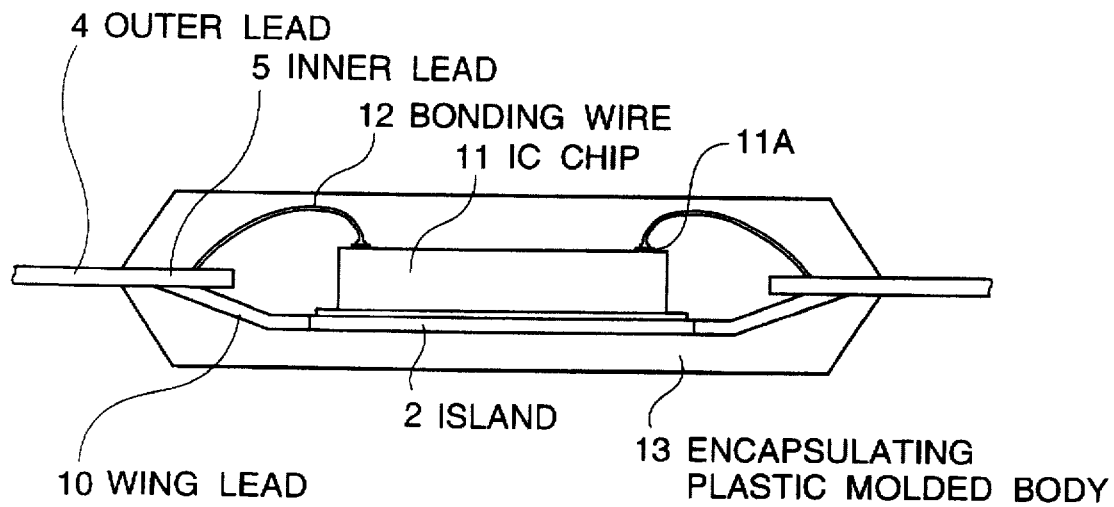
FIG. 3 is a diagrammatic sectional view of the conventional plastic packaged semiconductor device manufactured by using the conventional lead frame having the wing leads.
Figure 4:
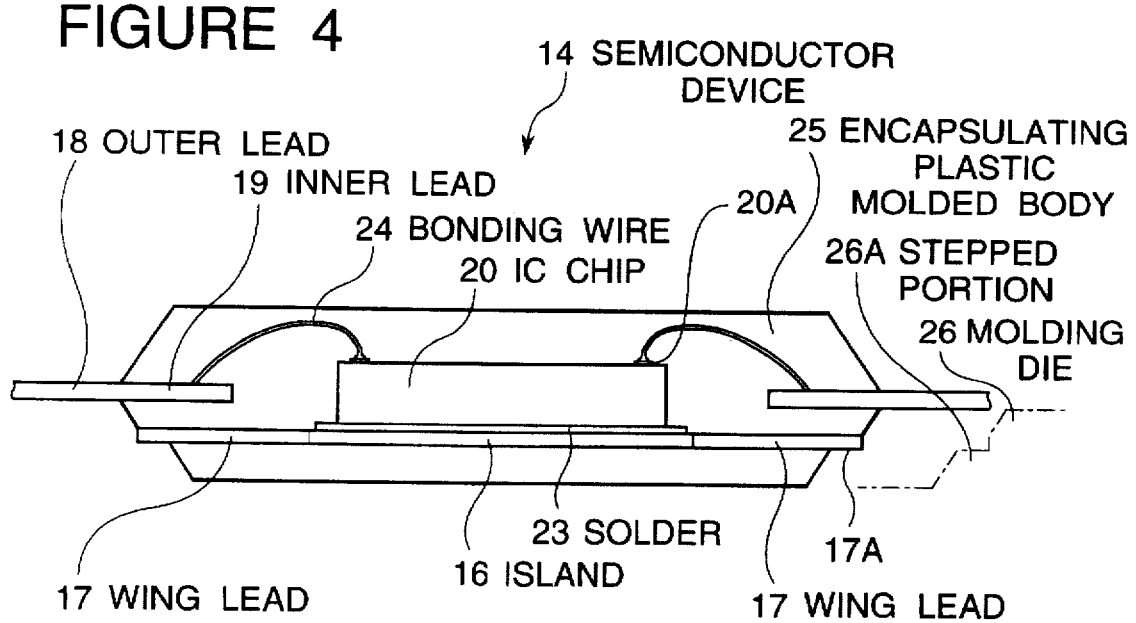
FIG. 4 is a diagrammatic sectional view of a first embodiment of the plastic packaged semiconductor device in accordance with the present invention.

Referring to FIG. 4, there is shown a diagrammatic sectional view of a first embodiment of the plastic packaged semiconductor device in accordance with the present invention. In FIG. 4, the plastic packaged semiconductor device is generally designated by Reference Numeral 14, and a first example of a lead frame used in the plastic packaged semiconductor device 14 is shown in a pattern diagram of FIG. 5, and generally designated by Reference Numeral 15.

Before explaining the plastic packaged semiconductor device 14 shown in FIG. 4, the lead frame 15 shown in FIG. 5 will be explained.

Figure 5:
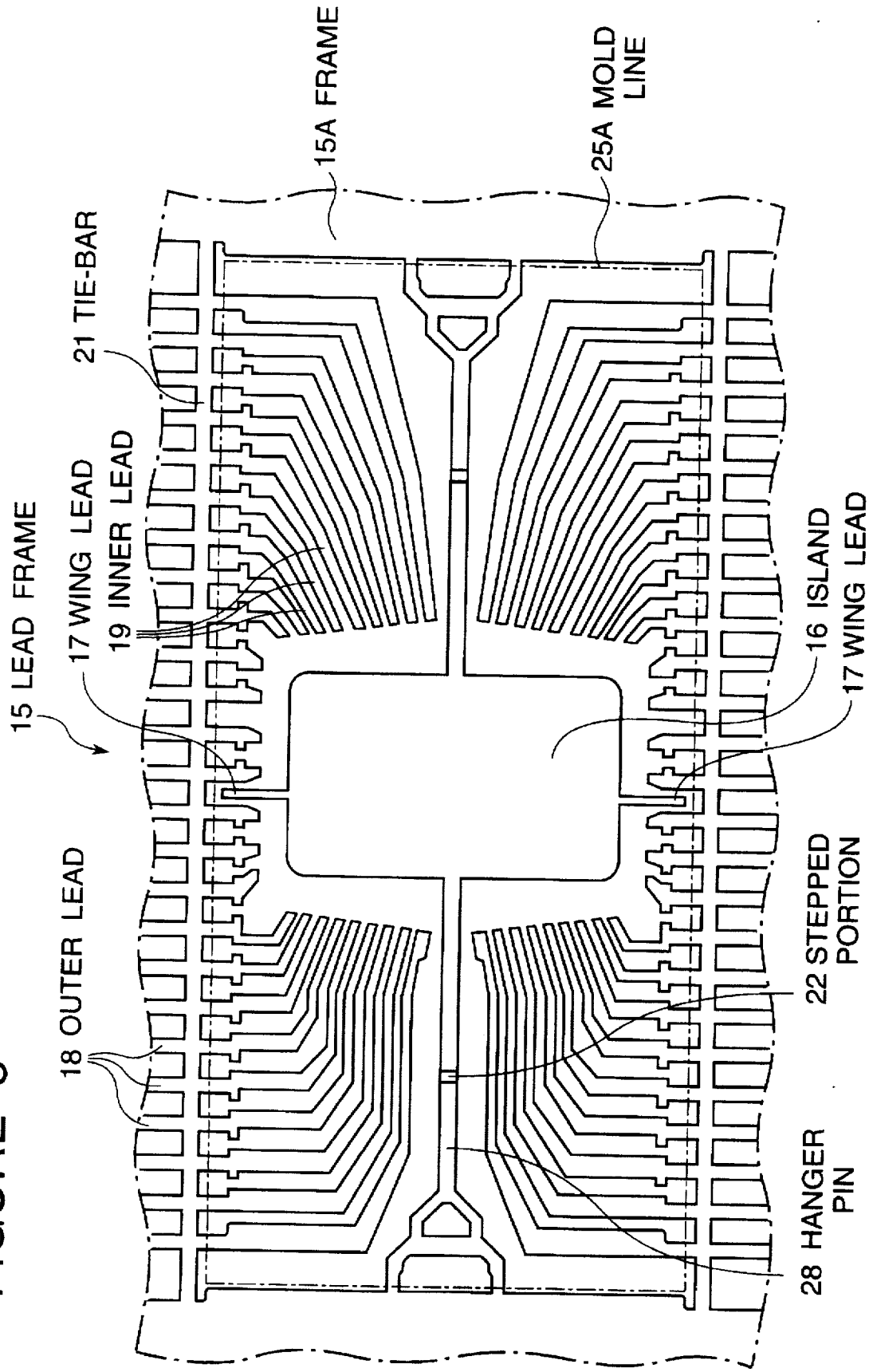
FIG. 5 is a pattern diagram of a first example of the lead frame in accordance with the present invention having a wing lead, used in the plastic packaged semiconductor device shown in FIG. 4.

As shown in FIG. 5, the lead frame 15 includes a rectangular island 16 for bearing thereon a semiconductor chip (designated with Reference Numeral 20 in FIG. 4), a pair of hanger pins 28 extending outwardly from a pair of opposite long-sides of the rectangular island 16 to a frame 15A of the lead frame 15 so that the island 16 is supported by the frame 15A, a number of outer leads 18 (of terminal leads) formed to extend outwardly from a plastic molded body (designated with Reference Numeral 25 in FIG. 4) of the plastic packaged semiconductor device, a number of inner leads 19 formed to be located within an inside of the plastic molded body and extending outwardly from a proximity of the island 16 to corresponding outer leads 18, a pair of tie-bars 21 for tying the outer leads 18 and for preventing flow-out of plastic when plastic packaging is carried out, and a pair of wing leads 17 extending outwardly from a pair of opposite short-sides of the rectangular island 16, each of the wing leads 17 10 extending between a pair of inner leads 19. The wing leads 17 function to expel the moisture penetrating into the plastic molded body (designated with Reference Numeral 25 in FIG. 4) to the outside of the plastic molded body, and therefore, can prevent occurrence of the cracks which would otherwise occur because of the heat added at the time of mounting the plastic packaged semiconductor device on the printed circuit board.

In the shown embodiment, the lead frame 15 is characterized in that the wing lead 17 extending from each short-side of the rectangular island 16 has a free outer end which is not coupled with the tie-bars 21 and which terminates in the inside of a mold line 25A, as clearly shown in FIG. 5, and the hanger pins 28 have a stepped portion which is provided in the way thereof and which can be formed by a depressing machining so that a plane of the island 16 is lower in level than a plane in which the inner leads 19 are positioned and the output leads 18 extend out from the encapsulating plastic molded body 25. On the other hand, since the wing leads 17 are not subjected to depress machining, the wing leads 17 are in the same plane as that of the island 16.

The embodiment of the semiconductor device 14 shown in FIG. 4 manufactured by using the lead frame 15 as mentioned above, is such that a semiconductor chip 20 is mounted or die-bonded on the island 16 by a mounting material 23 such as solder, and electrodes 20A on the semiconductor chip 20 are connected to the inner leads 19 through bonding wires 24 by a wiring bonding process. The island 16 and the semiconductor chip 20 thus assembled are encapsulated with a plastic molded body 25, as shown in FIG. 4.

At the time of encapsulating with plastic, a plastic-encapsulating lower molding die 26 having a stepped portion 26A at the same height as that of the island plane, as shown by the two-dot ghost line in FIG. 4, is used in combination with a conventional plastic-encapsulating upper molding die (not shown), in such a manner the wing leads 17 are supported on the stepped portion 26A, and then, plastic is injected into a space defined by the upper and lower molding dies, so that a lower surface 17A of the free outer end portion of the wing leads 17 in the same plane as the island plane is exposed from the shaped plastic molded body 25, as seen from FIG. 4.

Incidentally, as mentioned above, the island 16 is set down at a level lower than that of the terminal leads 18 and 19 by the depress-machining of the hanger pin 28 at the stepped portion 22. In this depress-machining, if the island 16 is set down at a level deeper than the stepped portion 26A of the plastic-encapsulating lower molding die 26 by the degree of 30 μm to 50 μm, it is possible to cause the free outer end of the wing lead 17 to be stably exposed from the shaped plastic molded body 25.

In the above mentioned embodiment, since the wing lead 17 of the lead frame 15 is not coupled to tie-bar 21, it is no longer necessary to cut off the wing lead 17. Accordingly, it is possible to use the conventional tie-bar cutting die having no wing lead cutting blade. Therefore, even if the lead pitch is narrowed, it is no longer difficult to machine the punch and die of the cutting die, nor is lift time of parts of the cutting die set become reduced.

Furthermore, since the wing leads 17 are not in the same places as that of the inner leads 19 and the outer leads 18, the wing leads 17 never interfere with the inner leads 19 and outer leads 18. Therefore, even if the pitch of the inner leads 19 and outer leads 18 (namely, the interval between the terminal leads) is narrowed, it is always possible to provide the wing leads 17, whereby package cracking can be surely prevented when the semiconductor device is mounted on a printed circuit board. In particular, in the shown embodiment, by optimizing the depress-machining of the stepped portion 22 of the hanger pins 28 relative to the level of the stepped portion 26A of the plastic-encapsulating lower molding die 26, the wing lead 17 can be stably exposed from the shaped plastic molded body 25, thereby certainly prevents the package cracking.

Figure 6:
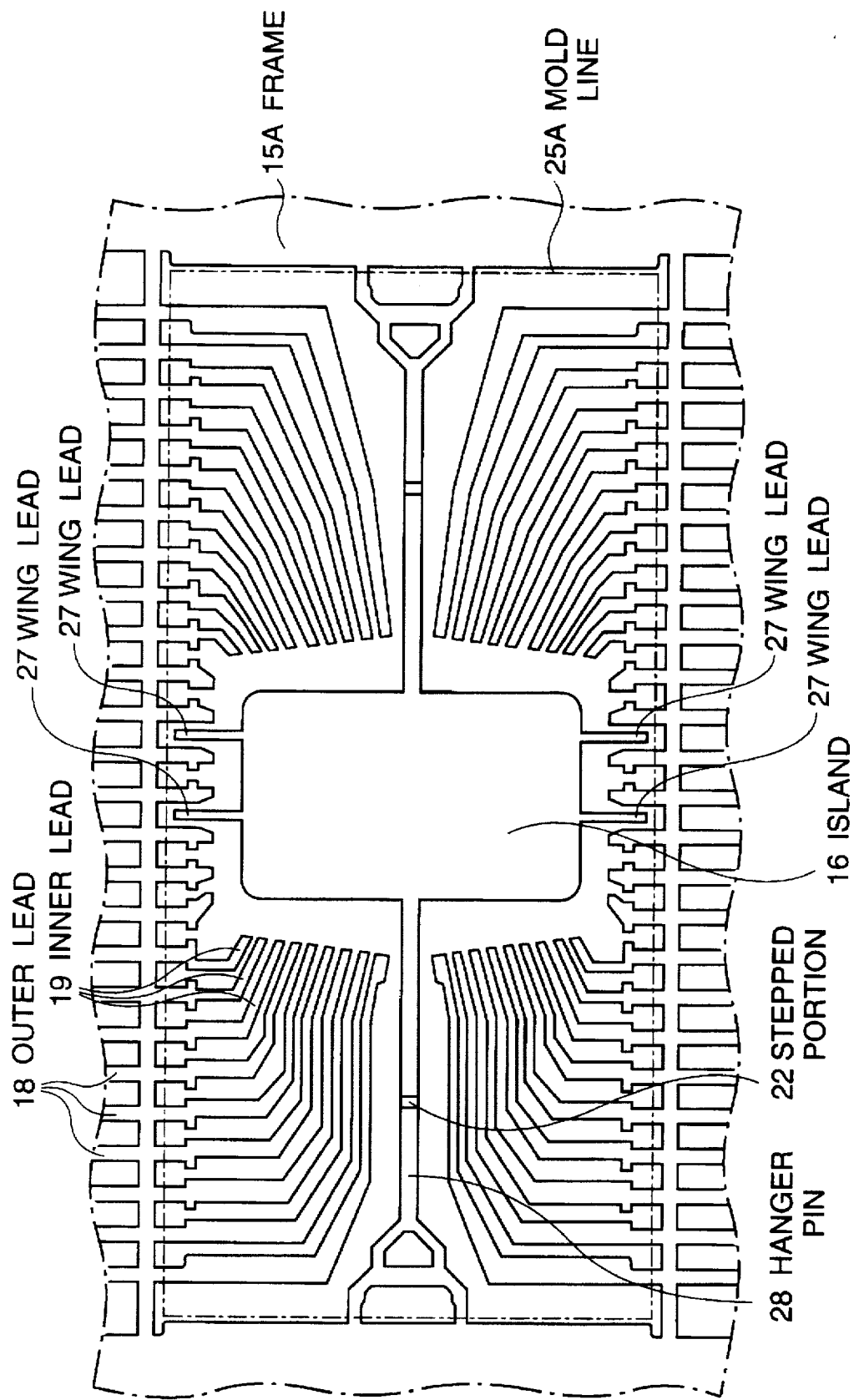
FIG. 6 is a pattern diagram of a second example of the lead frame in accordance with the present invention having a wing lead, used in the plastic packaged semiconductor device shown in FIG. 4.

As seen from the above, since restriction to the number and the position of the wing leads 17 disappears, the degree of freedom in designing the lead frame is increased. For example, four lead frames 27 can be provided as shown in FIG. 6, in order to increase the moisture expelling effect. In FIG. 6, elements similar to those shown in FIG. 5 are given the same Reference Numerals, and explanation thereof will be omitted. From FIG. 6, it would be understood that it is possible to provide the wing leads even if the lead pitch is narrowed.

Figure 7:
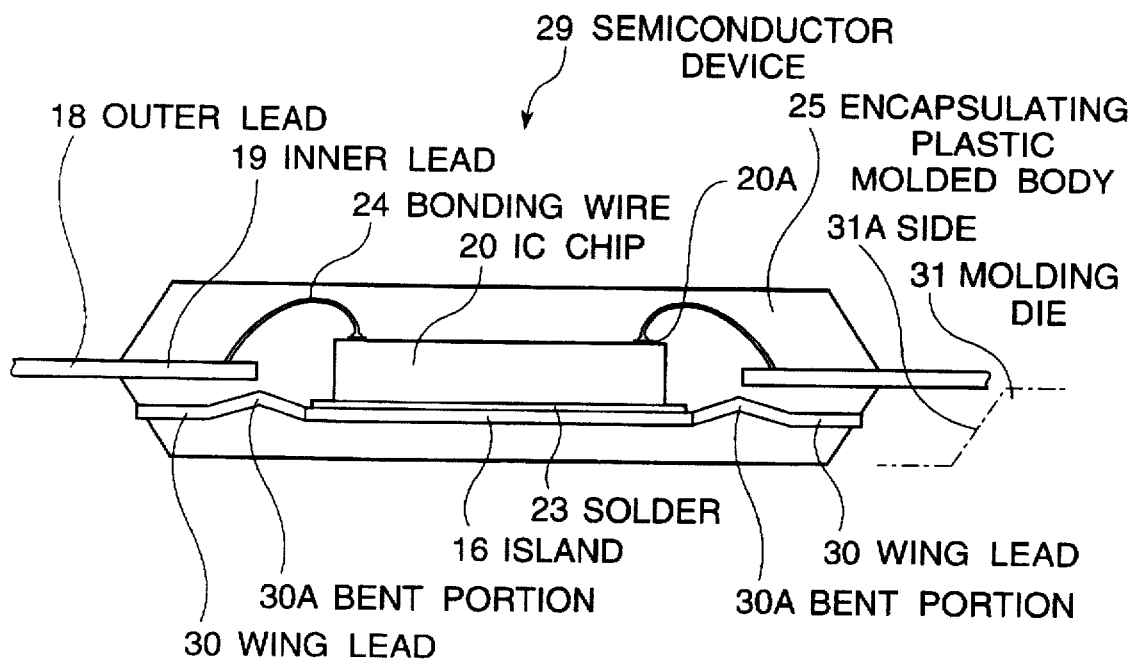
FIG. 7 is a diagrammatic sectional view of a second embodiment of the plastic packaged semiconductor device in accordance with the present invention.

Referring to FIG. 7, there is shown a diagrammatic section view of a second embodiment of the plastic packaged semiconductor device in accordance with the present invention. In FIG. 7, elements similar to those shown in FIG.

4 are given the same Reference Numerals, and explanation thereof will be omitted.

As seen from comparison between FIGS. 4 and 7, the second embodiment of the plastic packaged semiconductor device is generally designated with Reference Numeral 29, and is characterized in that each wing lead 30 extending outwardly from the island 16 has a length slightly longer than the distance between the edge of the island and the side surface of the plastic-encapsulating molding die at level of the island and has an upward bent portion 30A, but a free outer end portion of the wing lead 30 is in the same plane as that of the island 16.

The plastic packaged semiconductor device 29 of the second embodiment has the same advantage as that obtained in the plastic packaged semiconductor device 14 of the first embodiment. Furthermore, since the wing lead 30 has the bent portion 30A, when the wing lead 30 is compressed in a lengthwise direction, a restoring force is exerted. In other words, a spring action occurs. Therefore, if the plastic encapsulation is carried out when the free outer end of the wing lead 30 is resiliently pushed onto a side surface 31A of a conventional plastic-encapsulating lower molding die 31, the wing lead 30 ceaselessly exerts a pushing force against the side surface 31A of the molding die 31 in the course of the plastic encapsulating process, so that the free outer end of the wing lead 30 is surely exposed from the plastic molded body 25. As a result, package cracking can be surely prevented.

The invention has thus been shown and described with reference to the specific embodiments. However, it should be noted that the present invention is in no way limited to the details of the illustrated structures but changes and modifications may be made within the scope of the appended claims.

In the above mentioned embodiments, the hanger pins are depress-machined in order to put the wing leads and the terminal leads at different level planes, respectively. However, the wing leads may be depress-machined in place of the hanger pin. In addition, the number and the location of the inner leads, the outer leads and the hanger pins shown in FIGS. 5 and 6 may be freely modified.

In the second embodiment, the wing lead can be bent downward, in place of the upward bent portion 30A. Furthermore, two or more bend portions may be provided in the wing lead. As a means for forcedly pushing the tip end of the wing lead to the side surface of the plastic-encapsulating molding die, the wing lead can be formed to have a length slightly longer than the distance between the side of the island and the side surface of the plastic-encapsulating molding die, and the wing lead can be resiliently deformed by slightly bending the wing lead, so that the tip end of the wing lead is pushed against the side surface of the plastic-encapsulating molding die.

As mentioned above, in the semiconductor device in accordance with the present invention, since the wing leads and the terminal leads are not in the same place, the wing leads never interfere with the terminal leads. Therefore, even if the pitch of the terminal leads is narrowed, since it is always possible to provide the wing leads, the package crack caused by thermal shock when the semiconductor device is mounted on a printed circuit board, can be surely prevented.

Furthermore, since, in the lead frame, the wing lead is not coupled to the tie-bar, it is no longer necessary to cut off the wing lead. Accordingly, it is possible to use the conventional tie-bar cutting die having no wing lead cutting blade. In addition, even if the lead pitch is narrowed, it is no longer difficult to machine the punch and the die of the cutting die, nor lift time of parts of the cutting die set reduced.

Moreover, since restriction in the number and the position of the wing leads disappears, degree of freedom in designing the lead frame is elevated.

I claim:

1. A plastic encapsulated semiconductor device comprising a semiconductor chip supported on an island, a plurality of terminal leads each having an inner lead and an outer lead, said inner lead of each terminal lead extending outwardly from a proximity of said island and being electrically connected to a corresponding electrode of said semiconductor chip through a connection wire, and at least one wing lead extending outwardly from said island between a pair of adjacent terminal leads of said terminal leads, and a plastic molded body encapsulating said semiconductor chip, said island, said inner lead of each terminal lead and said connection wire in such a manner that said outer lead of each terminal lead is projected from said plastic molded body and a tip end of said at least one wing lead is exposed from said plastic molded body so as to expel possible moisture contained in said plastic molded body, wherein said at least one wing lead extends outwardly from said plastic molded body in a plane different in level from a plane in which said terminal leads extend outwardly from said plastic molded body, so that said at least one wing lead does not interfere with said terminal leads, and also wherein said at least one wing lead extends in a direction toward a tie-bar for tying said terminal leads.

2. A plastic encapsulated semiconductor device as claimed in claim 1, wherein said at least one wing lead has a bent portion.

3. A plastic encapsulated semiconductor device as claimed in claim 1, wherein said plane in which said at least one wing lead extends outwardly from said plastic molded body is lower in level than said plane in which said terminal leads extend outwardly from said plastic molded body.

4. A plastic encapsulated semiconductor device as claimed in claim 3, wherein said at least one wing lead has a bent portion.

5. A plastic encapsulated semiconductor device as claimed in claim 1, wherein said at least one wing lead and said island extend in entirely the same plane.

* * * * *